United States Patent
Cho

(10) Patent No.: US 7,663,731 B2
(45) Date of Patent: Feb. 16, 2010

(54) SYSTEM AND METHOD FOR MANUFACTURING LIQUID CRYSTAL DISPLAY PANEL, AND LIQUID CRYSTAL DISPLAY PANEL USING THE SAME

(75) Inventor: Yung Kil Cho, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 196 days.

(21) Appl. No.: 11/643,938

(22) Filed: Dec. 22, 2006

(65) Prior Publication Data

US 2007/0231477 A1    Oct. 4, 2007

(30) Foreign Application Priority Data

Mar. 17, 2006    (KR) .................. 10-2006-0024751

(51) Int. Cl.
 *G02F 1/13* (2006.01)
(52) U.S. Cl. .................................................... 349/187
(58) Field of Classification Search ............... 349/187
 See application file for complete search history.

(56) References Cited

U.S. PATENT DOCUMENTS

| 5,844,662 A | 12/1998 | Akimoto et al. | |
|---|---|---|---|
| 5,915,396 A | 6/1999 | Kinose | |
| 6,270,619 B1 | 8/2001 | Suzuki et al. | |
| 2003/0060922 A1* | 3/2003 | Schauer et al. | 700/213 |
| 2004/0084416 A1* | 5/2004 | Lee et al. | 216/100 |
| 2006/0120588 A1* | 6/2006 | Kwon et al. | 382/141 |

* cited by examiner

*Primary Examiner*—Sarah Song
(74) *Attorney, Agent, or Firm*—McKenna Long & Aldridge LLP

(57) ABSTRACT

A method of processing substrates for a liquid crystal display panel includes providing a first loader having a first port and a second port, concurrently inputting and outputting first substrates between a cassette at the first port and a processing assembly, and, processing the first substrates in the processing assembly.

19 Claims, 8 Drawing Sheets

SYSTEM AND METHOD FOR MANUFACTURING LIQUID CRYSTAL DISPLAY PANEL, AND LIQUID CRYSTAL DISPLAY PANEL USING THE SAME

This application claims the benefit of Korean Patent Application No. 10-2006-0024751, filed on Mar. 17, 2006, which is hereby incorporated by reference for all purposes as if fully set forth herein.

BACKGROUND OF THE INVENTION

1. Field of the Invention

The present invention relates to a liquid crystal display. More particularly, the present invention relates to a system and method for manufacturing a liquid crystal display panel, and a liquid crystal display panel manufactured thereby.

2. Description of the Related Art

Liquid crystal displays use electrical and optical properties of a liquid crystal material injected inside a panel to display images. Liquid crystal displays are widely applied to various fields such as a computer monitors or mobile communication terminals. Liquid crystal displays have advantages of small size, light weight, and low power consumption.

The manufacturing of liquid crystal displays requires numerous processes. The manufacturing requires a variety of equipment to perform each process and operators to operate the equipment. As a result, manufacturing of liquid crystal displays requires an enormous cost and sufficient space for operating the equipment.

Accordingly, increasing process efficiency and reduction of space requirements for manufacturing liquid crystal displays are important to increasing yield and reducing cost.

A related art method for etching thin film transistor substrates includes a single line having process chambers for coating and exposing substrates one by one. Another related art method includes a dual line having process chambers for coating and exposing substrates two by two. The single line related art method takes about 80 seconds to process each substrate. The dual line related art method takes about 45 seconds to process each substrate. The dual line performs more efficiently and requires less space for equipment compared with the single line, thus increasing the yield and reducing cost.

A system and method for manufacturing a liquid crystal display panel in the related art will be described below.

FIG. 1A is a schematic diagram illustrating the system for manufacturing a liquid crystal display panel in the related art. FIG. 1B is a diagram illustrating a method for operating the system for manufacturing a liquid crystal display panel shown in FIG. 1A.

Referring to FIG. 1A, the related art system for manufacturing a liquid crystal display panel includes a dual line. The dual line includes a process line for inputting substrates to be processed separate from a process line for outputting processed substrates.

The system for manufacturing a liquid crystal panel in the related art includes a loader 110, a cleaner 120, coaters 130-1 and 130-2, a transfer line 140, exposure units 150-1 and 150-2, a developer 160, a tester 170, and an unloader 180.

Operation of the above constructed system for manufacturing the liquid crystal display panel will be described below.

When substrates are supplied in a cassette through the loader 110 having two ports, each of the substrates is automatically processed in the cleaner 120, the coaters 130-1 and 130-2, the exposure units 150-1 and 150-2, the developer 160, and the tester 170. The processed-substrates are then outputted to a cassette and unloaded by the unloader 180.

A system and method for manufacturing a liquid crystal display panel in the related art, is shown in (A) of FIG. 1B. After the loader 110 loads a cassette filled with substrates to be processed, the substrates are inputted to a rear process chamber. After all the substrates are inputted, the empty cassette is unloaded and replaced with another filled cassette.

Similarly, as shown in (B) of FIG. 1B, at the unloader 180 the processed-substrates are outputted to a blank cassette. Once the blank cassette is filled with substrates, the filled cassette is unloaded and replaced with another blank cassette.

However, the system for manufacturing the liquid crystal display panel in the related art has a disadvantage in that two coaters 130-1 and 130-2 or two exposure units 150-1 and 150-2 perform the same process.

In the case where a processed-substrate has a defect, determining which of the two coaters 130-1 and 130-2 or two exposure units 150-1 and 150-2 processed the defective substrate is not accurate because the processes are not executed on a per-substrate or per-cassette basis. Thus, there is a disadvantage in that a cause of the defect cannot be accurately analyzed.

In addition, there is a drawback that it is difficult to determine a history of the manufacturing process.

FIG. 2A is a schematic diagram illustrating a structure of another system for manufacturing a liquid crystal display panel in the related art. FIG. 2B is a diagram illustrating a method for operating the system for manufacturing the liquid crystal display panel shown in FIG. 2A.

The system for manufacturing the liquid crystal display panel of FIG. 2A is a dual line system in which processes of inputting and outputting substrates are integrated, unlike the system in which the processes of inputting and outputting the substrates are separated.

Referring to FIG. 2A, the system for manufacturing the liquid crystal display panel includes a first loader 210 and a second loader 215 each including three ports, a cleaner 220, a first coater 230, a second coater 235, a first exposure unit 250, a second exposure unit 255, a developer 260, a tester 270, and transfer lines 280 and 285.

In other words, the system for manufacturing a liquid crystal display panel includes the first loader 210 and the second loader 215 of FIG. 2B at which both inputting and outputting of substrates occurs, and a production from two kinds of cassettes through the two loaders 210 and 215 is possible. Each of the loaders 210 and 215 needs at least three ports to perform the inputting and outputting of substrates and replacement of cassettes.

In the system for manufacturing the liquid crystal display panel of FIG. 2A, the substrates inputted through a loader are processed either through the first coater 230 or the second coater 235 and the first exposure unit 250 or the second exposure unit 255.

Accordingly, the coaters 230 and 235 and the exposure units 250 and 255 can perform processes different from each other, respectively. Thus, there is an advantage that the processes can be more effectively performed and a cause of a defective substrate can be analyzed because it is easy to determine the process history of each substrate.

However, as shown in FIG. 2B, the system for manufacturing the liquid crystal display panel requires a port for inputting substrates, a port for outputting substrates as well as a replacement port. Therefore, each of the loaders 210 and 215 should include at least three ports.

Also, the transfer lines 280 and 285 that connect the respective ports with process chambers are required. This excessively increases the installation area required for equipment, and reduces efficiency of space.

SUMMARY OF THE INVENTION

Accordingly, the present invention is directed to a system and method for manufacturing a liquid crystal display panel, and a liquid crystal display panel using the same that substantially obviates one or more of the problems due to limitations and disadvantages of the related art.

An advantage of the present invention is to provide a system and method for manufacturing a liquid crystal display panel, and a liquid crystal display panel using the same in which ports for loading and unloading substrates in manufacturing a liquid crystal display may be integrated into one port, thereby reducing an installation area of an entire equipment and making more efficient operation possible.

Another advantage of the present invention is to provide a system and method for manufacturing a liquid crystal display panel, and a liquid crystal display panel using the same, in which a manufacturing process is performed pursuant to a predetermined process sequence without distinguishing models of substrates to be processed, thereby making it possible to analyze a cause of product failure when the product failure is generated.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of processing substrates for a liquid crystal display panel includes: providing a first loader having a first port and a second port; concurrently inputting and outputting first substrates between a cassette at the first port and a processing assembly; and processing the first substrates in the processing assembly.

In another aspect of the present invention, a method of processing substrates for a liquid crystal display panel includes: providing a first loader having two ports; concurrently inputting and outputting first substrates from a group of cassettes loaded through each port of the first loader; transferring the first substrates via a transfer line; and processing the first substrates in a first process unit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF ILLUSTRATED EMBODIMENTS

Reference will now be made in detail to embodiments of the present invention, example of which is illustrated in the accompanying drawings.

Figure 1A:
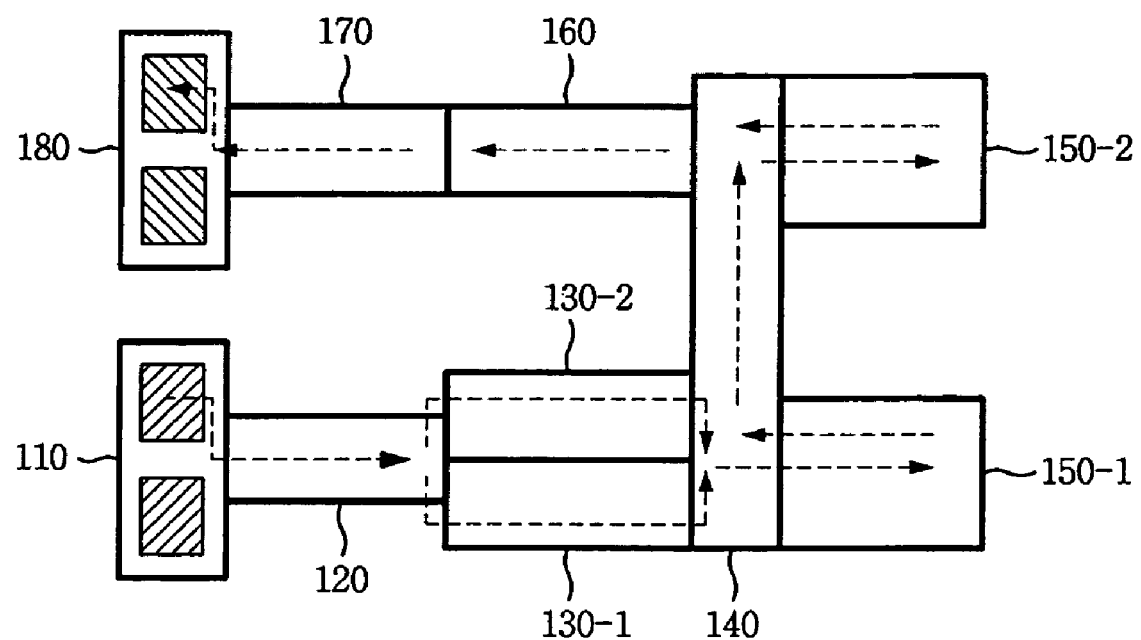
FIG. 1A is a schematic diagram illustrating a system for manufacturing a liquid crystal display panel in the related art.
Figure 1B:
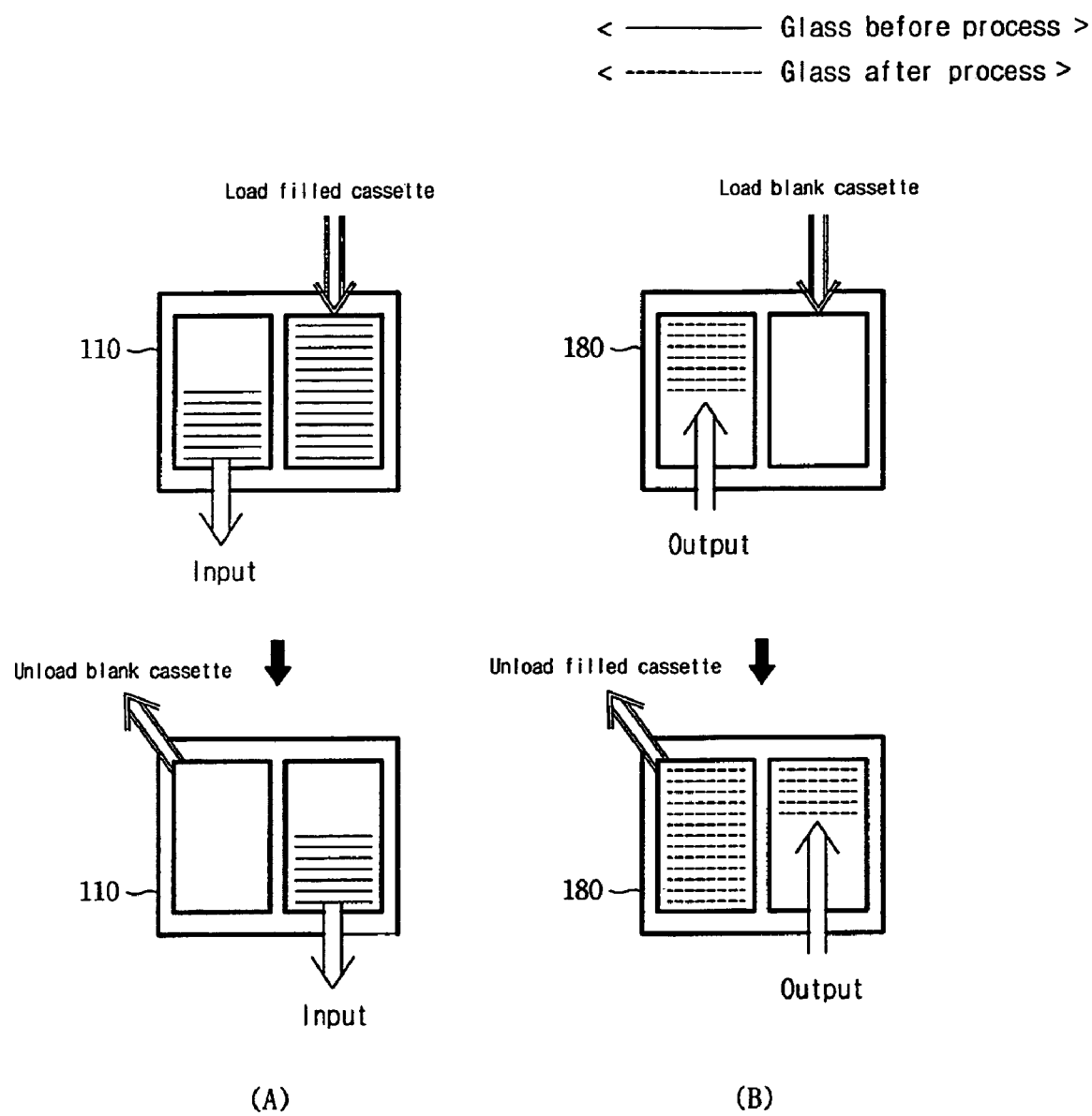
FIG. 1B is a diagram illustrating a method for operating the system for manufacturing the liquid crystal display panel shown in FIG. 1A.
Figure 2A:
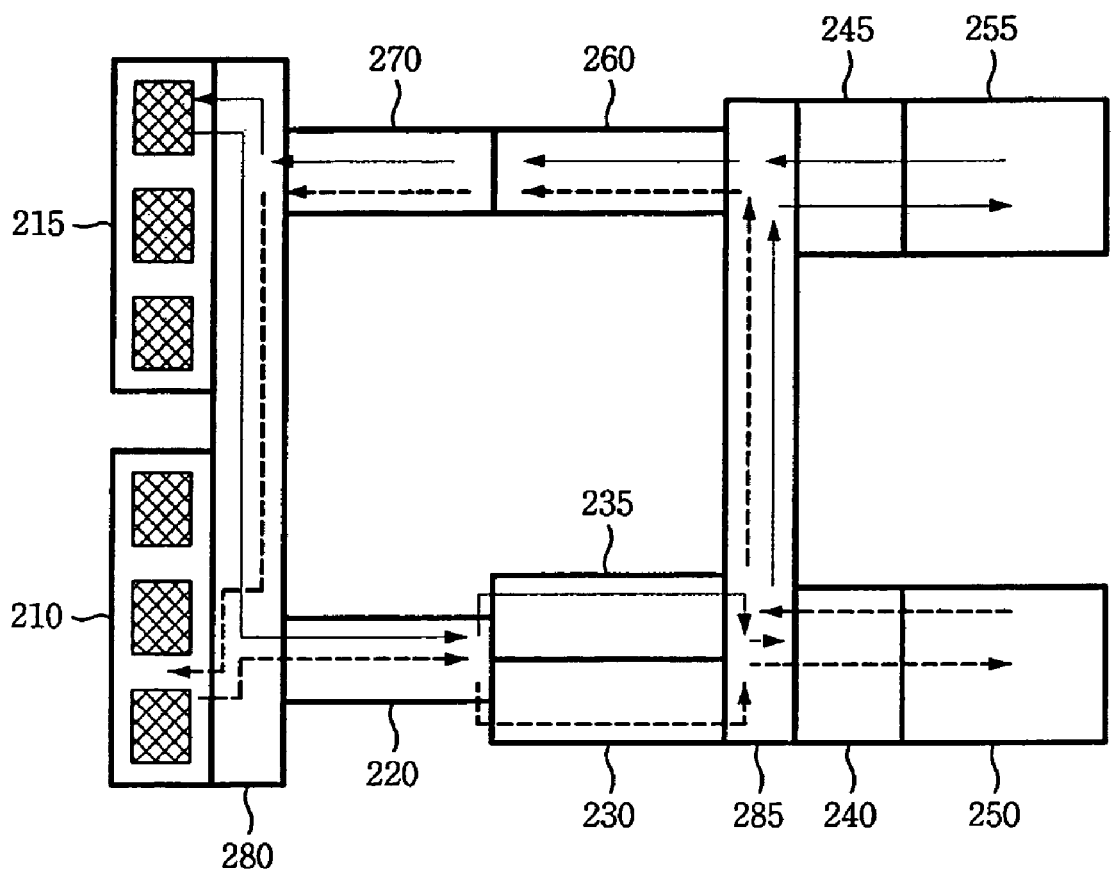
FIG. 2A is a schematic diagram illustrating another system for manufacturing a liquid crystal display panel in the related art.
Figure 2B:
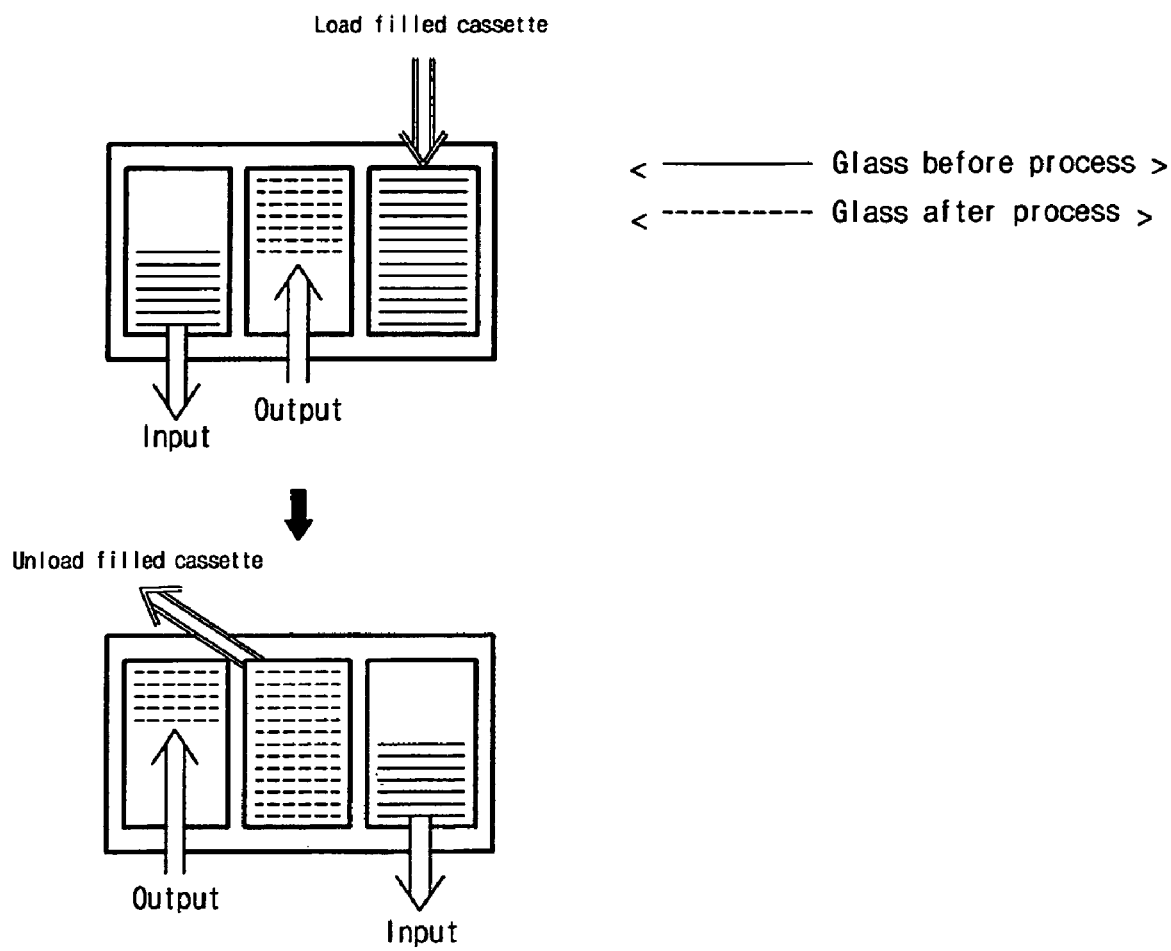
FIG. 2B is a diagram illustrating a method for operating the system for manufacturing the liquid crystal display panel shown in FIG. 2A.
Figure 3:
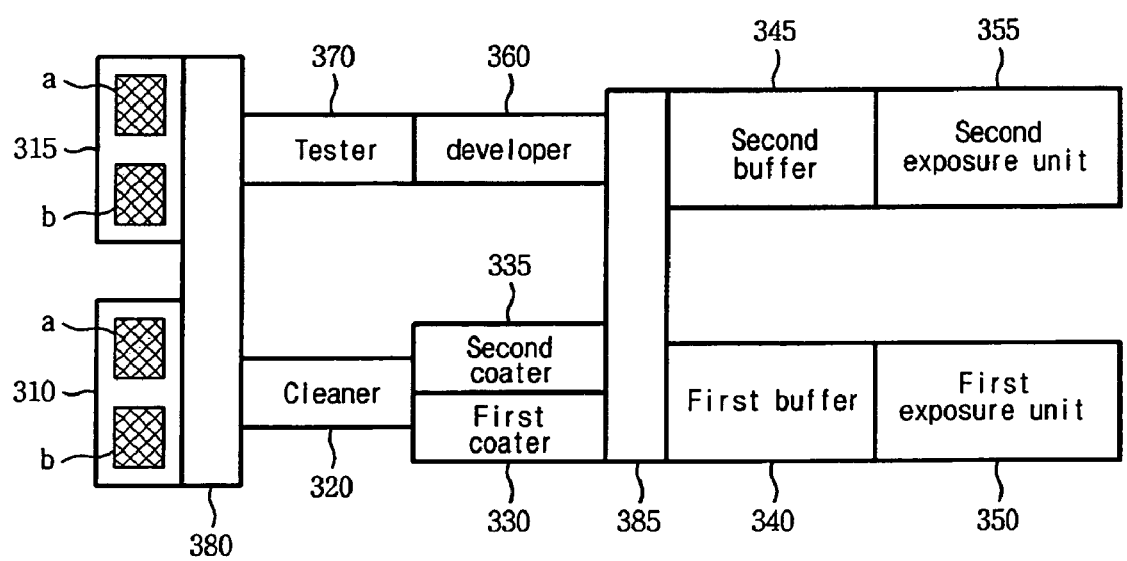
FIG. 3 is a diagram illustrating a system for manufacturing a liquid crystal display panel according to an exemplary embodiment of the present invention.
Figure 4:
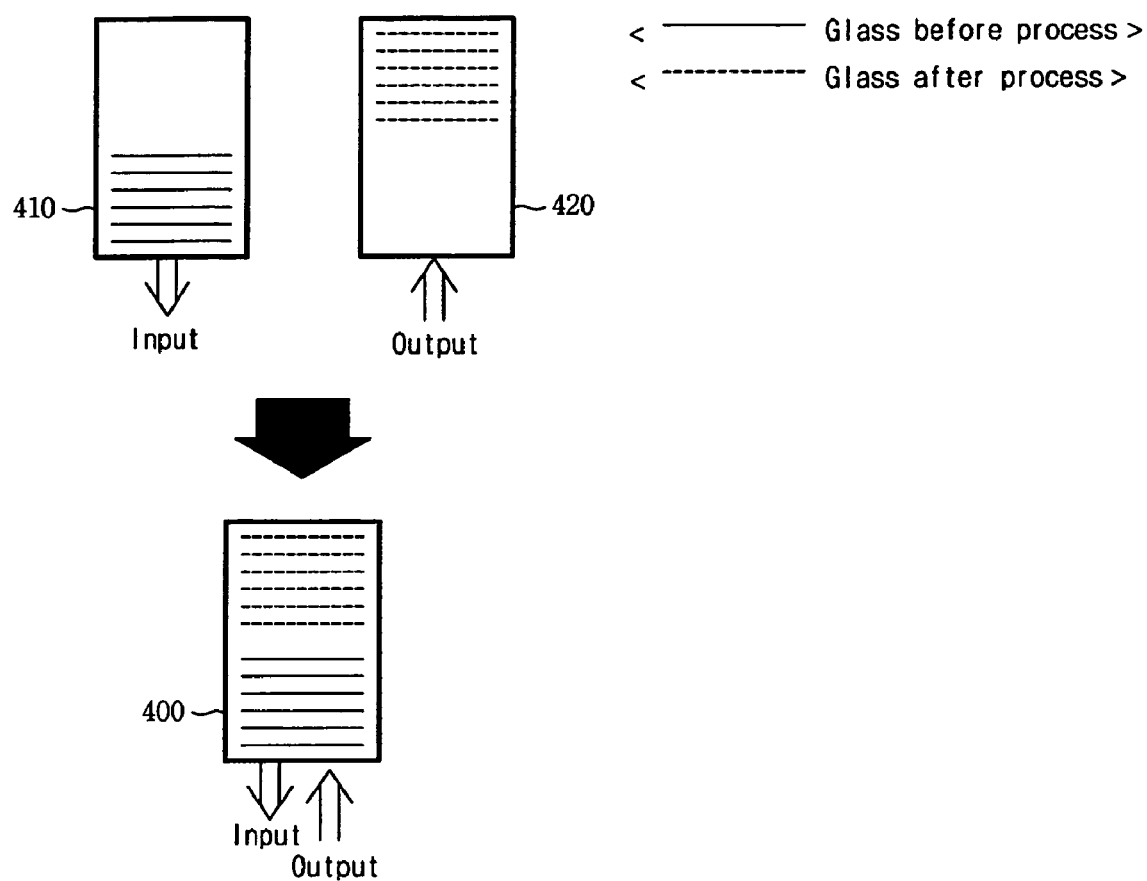
FIG. 4 is a conceptual diagram illustrating a method for managing a port in a system for manufacturing a liquid crystal display panel according to an exemplary embodiment of the present invention.
Figure 5:
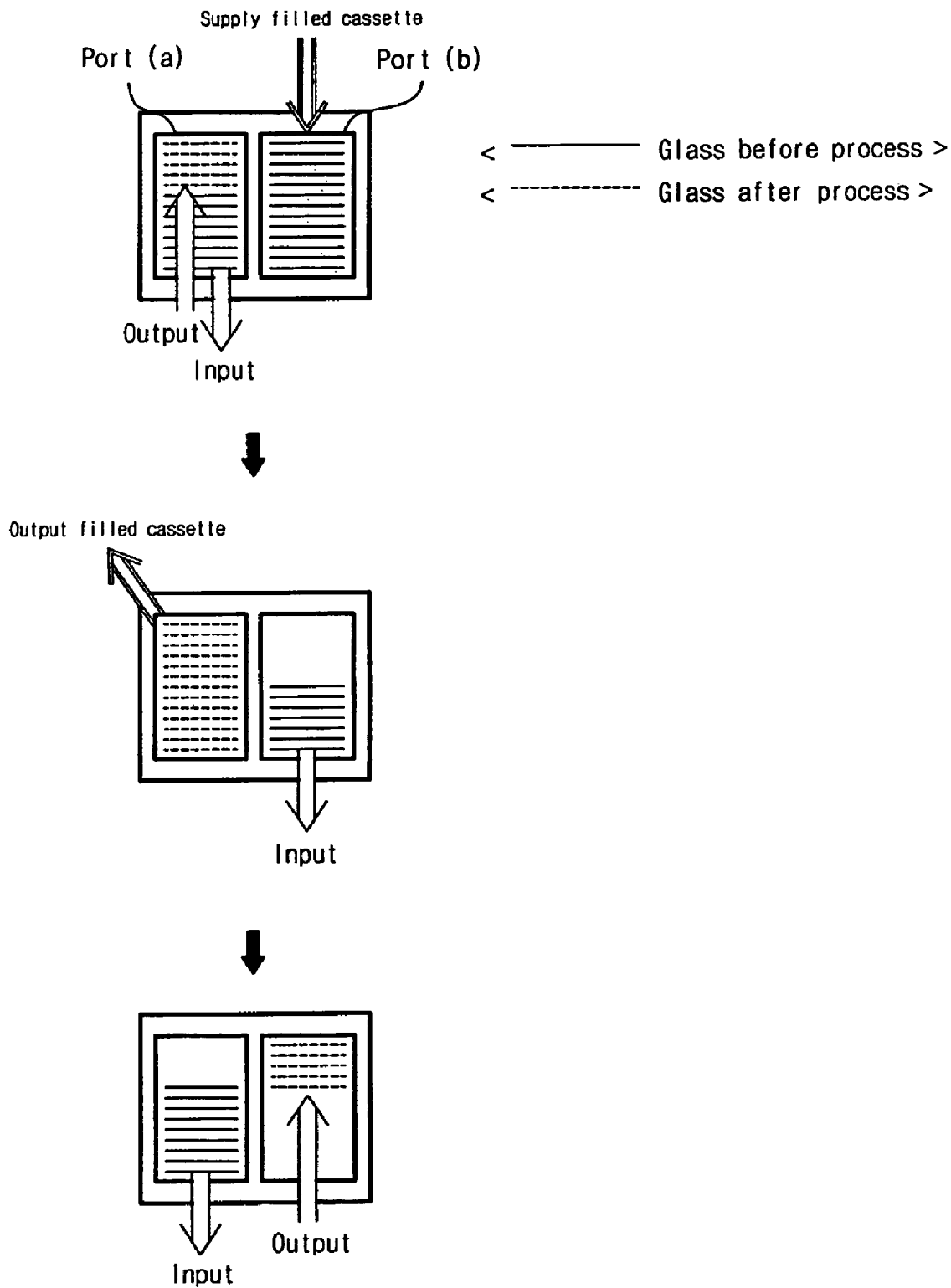
FIG. 5 is a diagram illustrating an operation for inputting and outputting substrates in a loader of a system for manufacturing a liquid crystal display panel according to an exemplary embodiment of the present invention.

FIG. 3 illustrates a system for manufacturing a liquid crystal display panel according to an exemplary embodiment of the present invention. FIG. 4 is a conceptual diagram illustrating a method for managing a port in the system for manufacturing a liquid crystal display panel according to an exemplary embodiment of the present invention. FIG. 5 is a diagram illustrating an operation for inputting and outputting substrates at a loader of the system for manufacturing a liquid crystal display panel according to an exemplary embodiment of the present invention.

Referring to FIG. 3, the system for manufacturing a liquid crystal display panel may include a first loader 310, a second loader 315, a cleaner 320, a first coater 330, a second coater 335, a first buffer 340, a second buffer 345, a first exposure unit 350, a second exposure unit 355, a developer 360, a tester 370, and transfer lines 380 and 385.

The first loader 310 and the second loader 315 may each include two ports (a, b).

Processes for inputting and outputting substrates from a cassette may be performed at each port (a, b). Particularly, inputting and outputting substrates from the same cassette may be concurrently performed.

Referring in detail to FIG. 4, in an embodiment of the present invention, a inputting port 410 and an outputting port 420 may be integrated into one port 400 so that the substrates may be concurrently inputted and outputted from the same cassette. This is unlike the related art in which the inputting port 410 and the outputting port 420 are separately operated so that the substrates to be processed are inputted into a rear process chamber through the inputting port 410, and the processed substrates are outputted through the outputting port 420.

This reduces the minimal number of ports required to load and unload the cassettes and input and output the substrates, thereby reducing the space required for equipment compared with the related art system.

As shown in FIG. 5, since substrates supplied in a first cassette may be inputted and outputted through one port (i.e. a or b), space is generated at another port for unloading a second cassette filled with processed substrates and loading a third cassette filled with substrates to be processed while substrates are being inputted and outputted from the first cassette.

After a filled cassette is loaded through each port (a, b) of the first loader 310 and the second loader 315, the substrates to be processed are inputted and processed, and the processed substrates are outputted into the space of the cassette. Thereafter, the cassette filled with processed substrates is unloaded.

At the first loader 310 and the second loader 315, substrates may be concurrently inputted and outputted from one cassette without instead of separately operating cassettes for inputting and outputting the substrates. Accordingly, when cassettes are loaded and unloaded from the loaders, the cassettes may always filled with substrates.

The substrates inputted would not necessarily be outputted again to the same cassette. When a sequential process is continuously performed, the substrates inputted and outputted from a given cassette may be different substrates.

It is possible to concurrently perform two different processes and determine a process history of the processed-substrates. Substrates are inputed and outputted at the first loader 310 and the second loader 315 each through a designated process chamber. For example, the substrates that are inputted and outputted at the first loader are only processed in the first coater 330 and the first exposure unit 350, and the substrates that are inputted and outputted at the second loader are only processed in the second coater 335 and the second exposure unit 355.

Processing units that may be included within an embodiment of the present invent will now be described.

The cleaner 320 cleans the substrates inputted at the first loader 310 and the second loader 315, thereby removing organic matters and foreign materials from substrate surfaces.

The first coater 330 and the second coater 335 refer to process chambers for coating a photo resist on the substrates. Coating methods include, for example, a slit method, a spin method, and an inkjet printing method.

The first exposure unit 350 and the second exposure unit 355 may form a mask pattern on the substrates coated with the photo resist.

The first buffer 340 and the second buffer 342 refer to standby lines for waiting until the substrates are transferred to the first exposure unit 350 and the second exposure unit 355.

The developer 360 may remove an exposed portion of the substrates exposed by the first exposure unit 350 or the second exposure unit 355.

The tester 370 tests the substrates passing through the earlier process chambers, and detects a defect such as a stain.

The system for manufacturing the liquid crystal display panel according to an exemplary embodiment of the present invention is operated as follows.

Figure 6:
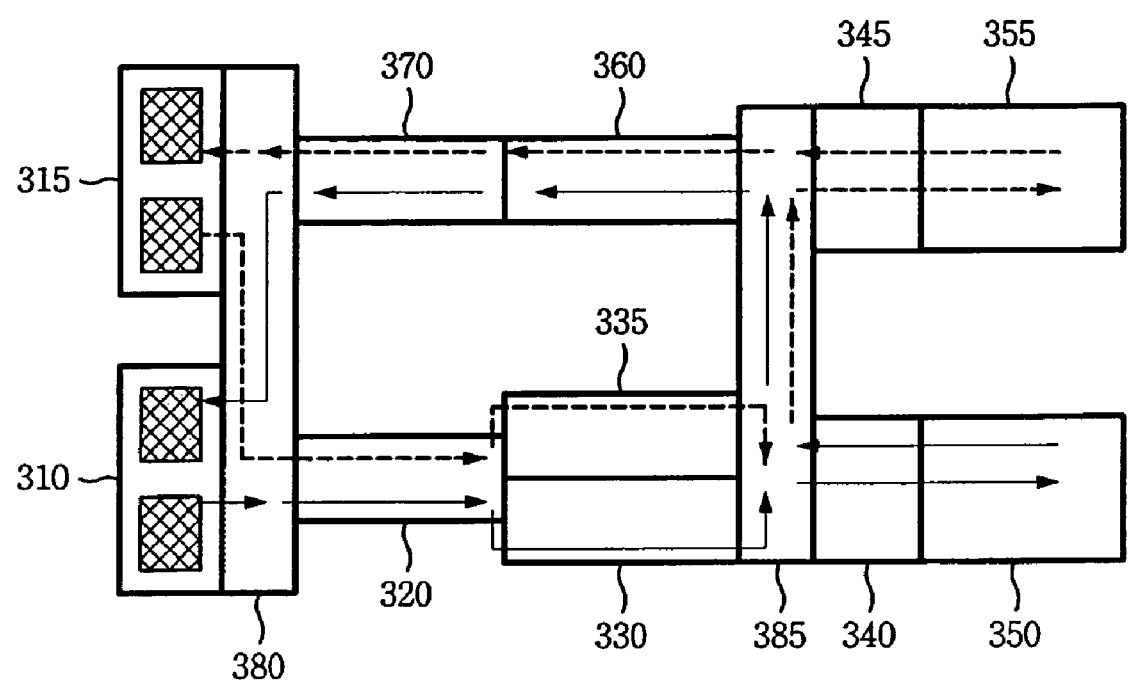
FIG. 6 is a diagram illustrating a whole process in a system for manufacturing a liquid crystal display panel according to an exemplary embodiment of the present invention.

FIG. 6 is a diagram illustrating an entire process in the system for manufacturing the liquid crystal display panel according to an exemplary embodiment of the present invention.

Referring to FIG. 6, substrates inputted through the first loader 310 and the second loader 315 may be cleaned by the cleaner 320 and then, proceed to the first coater 330 and the second coater 335, respectively. If the substrates provided from the first loader 310 are provided to the first coater 330, the substrates provided from the second loader 315 should be provided to the second coater 335. If the substrates provided from the first loader 310 are provided to the second coater 335, the substrates provided from the second coater 315 should be provided to the first coater 330. This is identically applied to the first exposure unit 350 and the second exposure unit 355. Continuous and compulsory application is desirable until a system manager makes separate setting.

In the first buffer 340 and the second buffer 345, the substrates wait for exposure processes of the first exposure unit 350 and the second exposure unit 355, respectively.

Next, the substrates exposed using the first exposure unit 350 and the second exposure unit 355 are returned to the first loader 310 or second loader 315 through the developer 360 and the tester 370, and are outputted into a cassette at a port of the first loader 310 or second loader 315.

A first transfer line 380 may transfer substrates between the second loader 315 and the cleaner 320 and between the tester 370 and the first loader 310. A second transfer line 385 may transfer substrates between the first coater 330 or the second coater 335 and the second buffer 345 and between the first exposure unit 350 and the developer 360.

A structure and a function of a liquid crystal display panel manufactured by the above processes will be briefly described as follows.

The liquid crystal display panel, though not illustrated, may include a lower substrate, an upper substrate, and a liquid crystal provided between the two substrates.

The lower substrate may include a gate line, a data line, a thin film transistor, and a pixel electrode. The upper substrate is positioned opposite the lower substrate to face the lower substrate, and may include a color filter, a black matrix, and a common electrode.

The lower substrate may include a plurality of gate lines and data lines arranged in m×n matrix. Thin film transistors, i.e. switching elements, may be formed at crossings of the plurality of gate lines and data lines.

The thin film transistor may include a gate electrode, a source electrode, a drain electrode, an active layer, and an ohmic contact layer. The drain electrode connects with the pixel electrode, and forms a unit pixel. A data signal applied to the data line in synchronization with a gate signal may be transmitted from the source electrode to the drain electrode through the ohmic contact layer and the active layer when the gate signal is applied to the gate electrode through the gate line.

When the data signal is applied to the source electrode, a voltage may be applied to the pixel electrode connecting with the drain electrode, thereby generating a voltage difference between the pixel electrode and the common electrode. The voltage difference between the pixel electrode and the common electrode may cause a variation of a molecular arrangement of a liquid crystal interposed therebetween. The variation of the molecular arrangement causes a variation of an amount of light transmittance in a pixel, and generates a color difference between the pixels depending on a difference between the data signals applied on a per-pixel basis. The color difference may be used for controlling a picture of a liquid crystal display.

The gate signal applied to the gate line and the data signal applied to the data line may be generated using a driving circuit such as a gate driver and a data driver. Tape Carrier Package (TCP) may connect the driving circuit with the liquid crystal display panel.

The color filter and the common electrode may be provided in the upper substrate as described above. Their positions may vary depending on a driving method of the liquid crystal display. In detail, the common electrode may be formed in the lower substrate in an In-Plane Switching (IPS) mode liquid crystal display. The color filter may be formed in the lower substrate in a Color-filter On Array (COA) mode liquid crystal display.

As described above, in the system for manufacturing the liquid crystal display panel and the liquid crystal display panel using the same, the same process as the three-port loader may be performed using a two-port loader.

Accordingly, there is an advantage that the efficiency of the process versus area required greatly increases, thereby improving yield and reducing cost.

It will be apparent to those skilled in the art that various modifications and variations can be made in the present invention without departing from the spirit or scope of the invention. Thus, it is intended that the present invention cover

What is claimed is:

1. A method of processing substrates for a liquid crystal display panel, comprising:
   providing a first loader having a first port and a second port;
   concurrently inputting and outputting first substrates in a cassette at the first port; and
   processing the first substrates in a processing assembly,
   wherein the first substrates output from the cassette at the first port are non-processed, and the first substrates input into the cassette at the first port are processed in the processing assembly, and at least one of the first substrates output from the cassette at the first port is input into a cassette at the second port.

2. The method according to claim 1, further comprising replacing a cassette at the second port while of concurrently inputting and outputting the first substrates at the first port.

3. The method according to claim 1, further comprising:
   providing a liquid crystal layer between one of the first substrates and an opposing substrate.

4. The method according to claim 1, wherein processing of the first substrates in the processing assembly comprises:
   cleaning the first substrates inputted from the first loader in a cleaner;
   coating a photo resist on the cleaned first substrates in a first coater;
   transferring the coated first substrates to a first buffer for waiting until the first substrates are inputted to a first exposure unit;
   forming a mask pattern on the coated first substrates in the first exposure unit;
   removing a portion of the exposed first substrates in a developer; and
   testing the developed first substrates for defects.

5. The method according to claim 1, further comprising:
   providing a second loader having a third port and a fourth port;
   concurrently inputting and outputting second substrates in a cassette at the third port; and
   processing the second substrates in the processing assembly;
   wherein the second substrates output from the cassette at the third port are non-processed, and the first substrates input into the cassette at the third port are processed in the processing assembly.

6. The method according to claim 5, further comprising:
   providing a common processing unit in the processing assembly; and
   processing the first substrates and the second substrates in the common processing unit.

7. The method according to claim 6, wherein the common processing unit is a cleaner, tester or developer.

8. The method according to claim 5, further comprising:
   providing first and second parallel processing units in the processing assembly;
   processing the first substrates in the first parallel processing unit; and
   processing the second substrates in the second parallel processing unit.

9. The method according to claim 8, wherein the first and second parallel processing units are coaters, buffers or exposure units.

10. The method according to claim 5, wherein the processing the first and second substrates in the processing assembly comprises:
    cleaning the first and second substrates inputted from the first and second loaders in a cleaner;
    coating a photo resist on the cleaned first substrates in a first coater;
    coating a photo resist on the cleaned second substrates in a second coater;
    transferring the coated first substrates to a first buffer for waiting until the first substrates are inputted to a first exposure unit;
    transferring the coated second substrates to a second buffer for waiting until the second substrates are inputted to a second exposure unit;
    forming a mask pattern on the coated first substrates in the first exposure unit;
    forming a mask pattern on the coated second substrates in the second exposure unit;
    removing a portion of the exposed first and second substrates in a developer; and
    testing the developed first and second substrates for defects.

11. A method of processing substrates for a liquid crystal display panel, comprising:
    providing a first loader having two ports;
    concurrently inputting and outputting first substrates from a group of cassettes loaded through each port of the first loader;
    transferring the first substrates via a transfer line; and
    processing the first substrates in a first process unit, wherein at least one of the first substrates output from the group of cassettes at the one port is input into the group of cassettes at the other port.

12. The method according to claim 11, further comprising:
    providing a second loader having two ports;
    concurrently inputting and outputting second substrates from a group of cassettes loaded through each port of the second loader;
    transferring the second substrates via the transfer line; and
    processing the second substrates in a second process unit.

13. The method according claim 12, further comprising commonly performing a manufacturing process in a common process unit for the substrates inputted from the first loader and the second loader.

14. The method according to claim 12, wherein the first loader and the second loader concurrently input and output substrates from the same cassette.

15. The method according to claim 14, wherein the substrates inputted and outputted from the same cassette are different from each other.

16. The method according to claim 14, wherein the substrates inputted and outputted from the same cassette are identical with each other.

17. The method according to claim 13, wherein the first process unit and the second process unit include a coater and an exposure unit, respectively.

18. The method according to claim 13, wherein the common process unit includes a cleaner and a testing.

19. The method according to claim 13, wherein the first process unit and the second process unit concurrently perform manufacturing processes different from each other, respectively.

* * * * *